United States Patent [19]

Mizutani

[11] Patent Number: 4,882,707
[45] Date of Patent: Nov. 21, 1989

[54] NON-VOLATILE SEMI-CONDUCTOR MEMORY DEVICE WITH DOUBLE GATE STRUCTURE

[75] Inventor: Yoshihisa Mizutani, Tokyo, Japan

[73] Assignee: Kabushiki Kaisha Toshiba, Kawasaki, Japan

[21] Appl. No.: 316,534

[22] Filed: Feb. 27, 1989

Related U.S. Application Data

[63] Continuation of Ser. No. 111,717, Oct. 23, 1987, abandoned.

[30] Foreign Application Priority Data

Oct. 27, 1986 [JP] Japan ................... 61-255149
Oct. 27, 1986 [JP] Japan ................... 61-255150
May 21, 1987 [JP] Japan ................... 62-122401

[51] Int. Cl.$^4$ ............... G11C 11/34; H01L 29/78; H01L 27/02; H01L 27/10
[52] U.S. Cl. ................... 365/185; 357/23.5; 357/41; 357/45
[58] Field of Search ............... 365/182, 185; 357/23.5, 357/41, 45, 51

[56] References Cited

U.S. PATENT DOCUMENTS

| 4,385,308 | 5/1983 | Uchida | 357/23.5 |
| 4,558,339 | 12/1985 | Angle | 365/185 |
| 4,589,009 | 5/1986 | Motamedi | 365/185 |
| 4,665,418 | 5/1987 | Mizutani | 357/23.5 |
| 4,698,787 | 10/1987 | Mukherjee et al. | 357/23.5 |
| 4,754,320 | 7/1988 | Mizutani et al. | 365/185 |
| 4,766,473 | 8/1988 | Kuo | 365/185 |
| 4,783,766 | 11/1988 | Samachisa et al. | 365/185 |

FOREIGN PATENT DOCUMENTS

2445078 4/1976 Fed. Rep. of Germany .
3346831 7/1984 Fed. Rep. of Germany .
59-126674 7/1984 Japan .
61-194875 8/1986 Japan .

OTHER PUBLICATIONS

IEEE Transactions on Electron Devices, vol. ED-34, No. 6, Jun. 1987, "Characteristics of a New EPROM Cell Structure with a Sidewall Floating Gate".
Y. Mizutani and K. Makita, in IEDM Tech. Dig., pp. 635-638, 1985.

Primary Examiner—Stuart N. Hecker
Assistant Examiner—Melissa J. Koval
Attorney, Agent, or Firm—Oblon, Spivak, McClelland, Maier & Neustadt

[57] ABSTRACT

A memory cell structure for a non-volatile semiconductor memory has a semiconductor substrate and first and second diffusion layers having a conductivity type opposite to that of the substrate, formed on the substrate and serve as a source and a drain. The second diffusion layer is coupled through a contact hole to a conductive layer that serves as a bit line. The functions of the first and second diffusion layers as the source and drain are reversed between data write and read modes. A floating gate and a control gate are insulatively provided on the substrate in parallel to each other. In either the data write mode or data read mode, the first and second diffusion layer are applied with a bias voltage while the control gate is initially applied with a ground voltage. A memory cell is selected by dropping the bias voltage on the second diffusion layer. The potential on the first diffusion layer is kept unchanged to constantly maintain the initially-applied bias voltage even when the memory cell is selected, so that the first diffusion layer is permitted to be coupled to the common wiring line together with the corresponding first diffusion layers of the other memory cells.

14 Claims, 9 Drawing Sheets

NON-VOLATILE SEMI-CONDUCTOR MEMORY DEVICE WITH DOUBLE GATE STRUCTURE

This application is a continuation of Ser. No. 111,717, filed on 10/23/87, now abandoned.

BACKGROUND OF THE INVENTION

The present invention relates to a non-volatile semiconductor memory device, and more particularly to an erasable programmable read-only memory.

An erasable programmable read-only memory (referred to as "EPROM" hereinafter) has been proposed in which each memory cell transistor has a "double-gate structure" of a floating gate and a control gate, which are formed above a channel region in a lateral side-by-side relation. In this type of EPROM, it has been proposed to access the memory by reversing the functions of the source and drain of two diffusion layers of each memory cell between a data write mode and a data read mode. More specifically, the first diffusion layer serving as the drain in data write mode is used as the source in the data read mode, while the second diffusion layer serving as the source in the data write mode is used as the drain in the data read mode. In accessing the memory cell, the data read/write efficiency can be improved and occurrence of malfunctions can be suppressed by reversing the functions of the source and drain of a cell transistor between the data read and write modes.

With the use of such an accessing technique, however, neither one of the two diffusion layers of each cell transistor can be coupled to a common wiring line. This enforces the utilization of the "double-bit line structure" in an EPROM that has two diffusion layers of each cell transistor coupled to independent bit lines. In this case, contact holes need to be provided separately for two diffusion layers of each cell and these diffusion layers should be coupled through the contact holes to the first and second bit lines that are separately running on a chip substrate. This results in a difficulty in designing the optimum wiring pattern for the memory cells on the substrate as well as an undesirable increase in the cell area. The complexed wiring pattern deteriorates the accessing speed of the EPROM.

SUMMARY OF THE INVENTION

It is therefore an object of the present invention to provide a new and improved non-volatile semiconductor memory device which has an excellent data read/write characteristic and has its element-occupying area minimized so as to improve the integration density.

In accordance with the above objects, the present invention is addressed to a memory device for a specific non-volatile semiconductor memory, which device comprises a semiconductive substrate of a first conductivity type, and first and second semiconductive diffusion layers of a second conductivity type that are formed in the substrate to be spaced apart from each other and serve as a source and a drain. The source and drain functions of the first and second diffusion layers are reversed between data write and read modes of the semiconductor memory. A first conductive layer is insulatively provided on the substrate to serve as a floating gate for storing carriers that represent information. A second conductive layer is also insulatively provided on the substrate to serve as a control gate.

In either the data write mode or the data read mode of the semiconductor memory, while the second conductive layer is initially applied with the ground potential, the first and second diffusion layers are applied with a bias voltage. The memory cell is selected by dropping the bias voltage on the second diffusion layer. The potential on the first diffusion layer does not change but constantly holds the initially-applied bias voltage when the memory cell is selected. Therefore, the first diffusion layer can be coupled together with first diffusion layers of other memory cells of the semiconductor memory to a common wiring line, whereby the aforementioned object of this invention can be achieved.

BRIEF DESCRIPTION OF THE DRAWINGS

In the detailed description of preferred embodiments of the invention presented below, reference is made to the accompanying drawings of which.

DETAILED DESCRIPTION OF THE PREFERRED EMBODIMENTS

Figure 1:
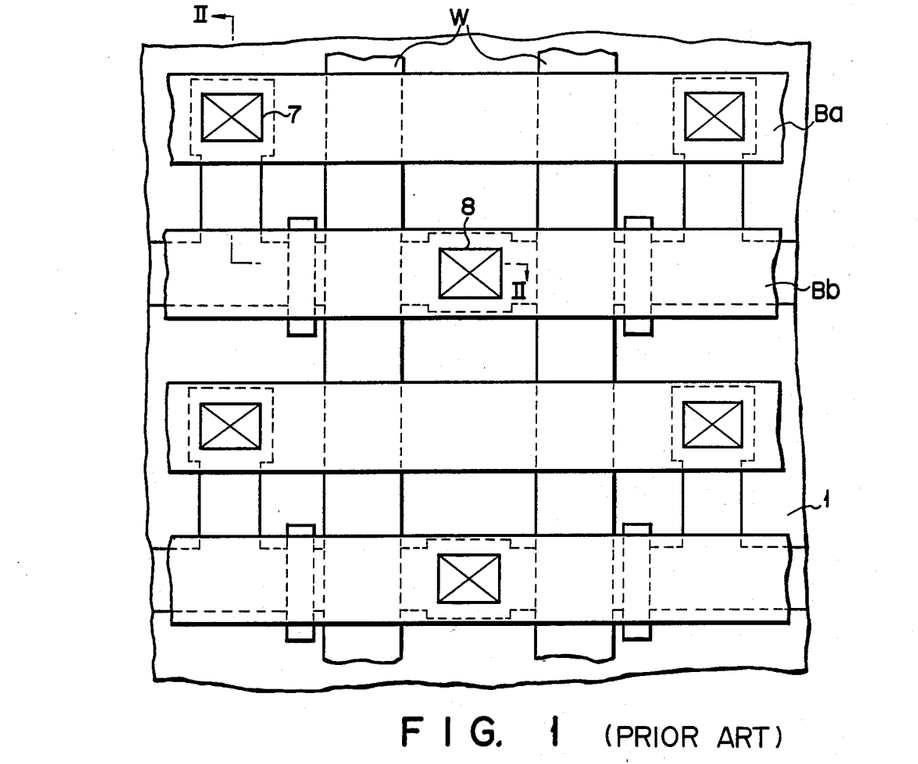
FIG. 1 is a schematic diagram illustrating the planar structure of an essential portion of a conventional EPROM.

Before going into an explanation of an erasable programmable read-only memory or EPROM of the present invention, a conventional EPROM will be explained with reference to FIGS. 1 and 2, in order to help understand the device structure of the present invention. (In FIG. 1 insulation layers are omitted only for the sake of diagrammatic simplicity.)

Figure 2:
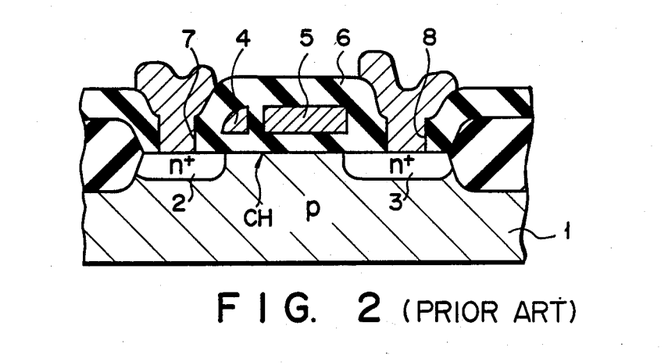
FIG. 2 is a cross-sectional view illustrating the conventional EPROM of FIG. 1 along line II—II.

FIG. 2 illustrates the cross-section of one memory cell of the conventional EPROM. Two heavily-doped n conductivity type (n+ type) semiconductor diffusion layers 2 and 3 are formed on a silicon substrate of a p conductivity type, distant from each other. A floating gate electrode 4 and a control gate electrode 5 are insulatively provided above substrate 1. These gates 4 and 5 are made of polycrystalline silicon and are substantially self-aligned with diffusion layers 2 and 3.

In an insulation layer 6 covering gate electrodes 4 and 5 are contact holes 7 and 8 formed separately for the first and second diffusion layers 2 and 3. As illustrated in FIG. 1, first and second diffusion layers 2 and 3 are coupled through contact holes 7 and 8 to two separate bit lines Ba and Bb. In FIG. 1 word lines W are running above substrate 1 to insulatively cross first and second bit lines Ba and Bb.

To write data into this memory cell, first diffusion layer 2 is used as a drain and second diffusion layer 3 as a source. When first diffusion layer 2 and control gate 5 are applied with a positive voltage, hot carriers (electrons in this case) are produced by impact ionization on the drain side of a channel region CH. Some of these electrons are trapped by floating gate 4 so as to store binary bit data.

In data read mode of this memory cell, in contrast to the case of the data write mode, first diffusion layer 2 is used as the source, and the second diffusion layer 3 as the drain. With a proper voltage (for example, +3 volts) being applied between the source and drain, control gate 5 is applied with a proper readout voltage (e.g., +3 volts). At this time, it is determined which logic level "1" or "0" the stored bit data has by detecting whether or not current flows between the source and drain.

The following is the reason why the source and drain function of a cell transistor are reversed between data write and read modes in accessing the memory cell. Since data writing utilizes injection of ho carriers into floating gate 4, the writing efficiency can be improved by making first diffusion layer 2 located close to floating gate 4 that stores the carriers to serve as the drain. However, if this first diffusion layer 2 is also used as the drain even in data read mode, first, when no carriers are stored in floating gate 4, a cell current flows indesirably to thereby cause, on the drain side of channel region CH, the impact ionization, which leads to unintentional writing in the memory cell. Second, floating gate 4 storing the carriers becomes remote from the source so that it is difficult to determine the logic level ("1" or "0") of the stored bit data. This may cause memory malfunction. In the data read mode, however, if first diffusion layer 2 is used as the source, the space between floating gate 4 and the source can be reduced. Therefore, if a depletion layer expands, due to the reverse bias, on the drain side of the channel region CH at the time of data reading, the data readout efficiency can be improved.

With the use of the above accessing technique involving the switching of the source and drain in an EPROM, it is not possible to fixedly couple one of the two diffusion layers 2 and 3 to a common wiring line. This is because the potential of each diffusion layer should be changed between the stand-by state and cell selection state in each operation mode. To overcome this problem, therefore, conventional EPROMs typically employ the "double-bit line structure" in which these diffusion layers 2 and 3 are separately coupled to first and second bit lines Ba and Bb, as illustrated in FIG. 1. In this case it is necessary to provide two types of bit lines on the substrate as well as to provide two separate contact holes 7 and 8 for each memory cell, thus complicating the cell layout and wiring pattern and increasing the element-occupying area. This would result in deterioration of the accessing speed and the integration density of the EPROM.

The above conventional problems can be effectively overcome by the EPROMs of this invention presented below.

Figure 3:
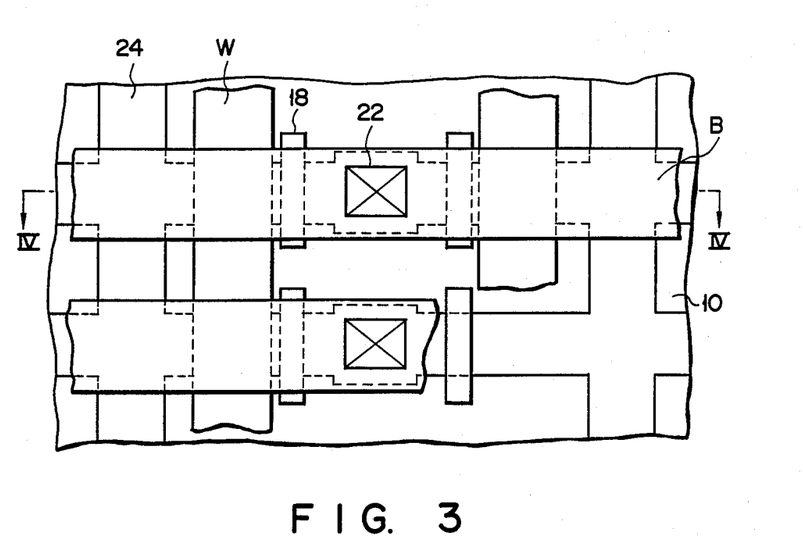
FIG. 3 is a schematic diagram illustrating the planar structure of an essential portion of an EPROM according to the first embodiment of this invention.
Figure 4:
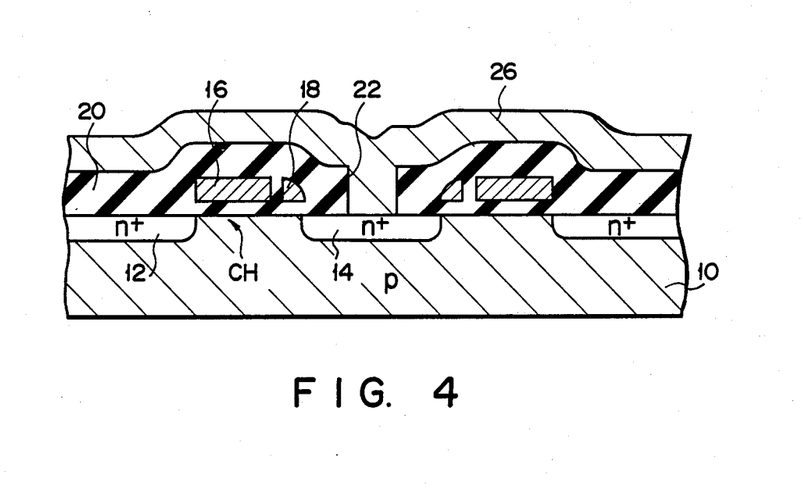
FIG. 4 is a cross-sectional view illustrating the EPROM of FIG. 3 along line IV—IV.

FIGS. 3 and 4 illustrate an EPROM according to the first embodiment of this invention. FIG. 3 shows the planer structure of an essential portion of the EPROM, wherein insulation layers are omitted only for the sake of diagrammatic simplicity. FIG. 4 shows a cross section of FIG. 3 along line IV-IV. In FIG. 4 two neighboring memory cells are formed on a p conductivity type silicon substrate 10. In one memory cell, two heavily-doped in conductivity type (n+ type) diffusion layers 12 and 14 are formed with a given space therebetween. A control gate 16 and a floating gate 18 are insulatively provided above substrate 10. These gates 16 and 18 are arranged in parallel a illustrated. Gate layers 16 and 18, which are made of polycrystalline silicon, are substantially self-aligned with diffusion layers 12 and 14. As illustrated in FIG. 3, control gate 16 extends elongated over an array of memory cells to form a word line W. Floating gate 18 is independent in each memory cell. The fabrication method for control gate 16 and floating gate 18 arranged in parallel is disclosed for example in the article "A NEW EPROM CELL WITH A SIDEWALL FLOATING GATE FOR HIGH-DENSITY AND HIGH-PERFORMANCE DEVICE" by Yoshihisa MIZUTANI and Koji MAKITA, International Electron Devices Meeting, Washington D.C., December 1985, pages 636-637 (FIG. 3).

An insulation layer 20 is deposited on substrate 10 so that gate layers 16 and 18 are embedded in the layer 20. A contact hole 22 is formed in insulation layer 20. First diffusion layer 12 is coupled to an elongated diffusion layer 24 that is formed in substrate 10 and serves as a common wiring line C. The diffusion layer 24 as common wiring line C is coupled in common to the first diffusion layers 12 of all the memory cells (including those not shown in FIG. 3) that are provided on substrate 10. (In FIG. 3 only four memory cells are shown so that only that portion of the common wiring line C in substrate 10 which runs parallel to word line W is illustrated.) Second diffusion layer 14 is electrically coupled through contact hole 22 to a metal layer 26, which is formed on insulation layer 20 to insulatively cross common wiring line C and serves as the bit line of the EPROM. It should be noted that in this memory cell, control gate 16 is located closer than the floating gate 18 to first diffusion layer 12 coupled to diffusion layer 24 serving as the common wiring line, C, while floating gate 18 is located closer than the control gate 16 to second diffusion layer 14 coupled to bit line B.

Figure 5A:
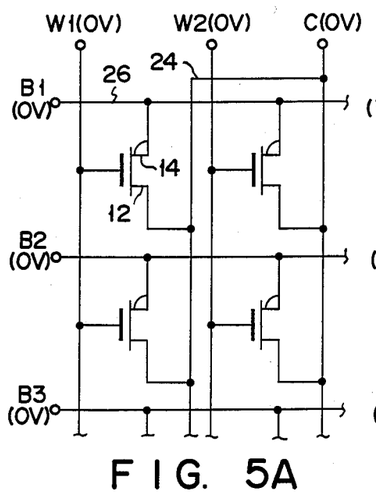
FIGS. 5A to 5D are diagrams illustrating equivalent circuits of an essential portion of the EPROM according to the first embodiment, for explaining data write/read mode of this EPROM.
Figure 5B:
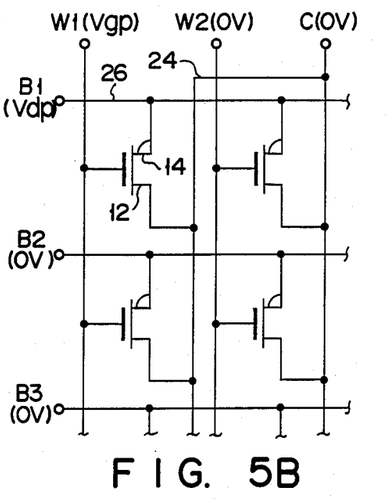
Figure 5C:
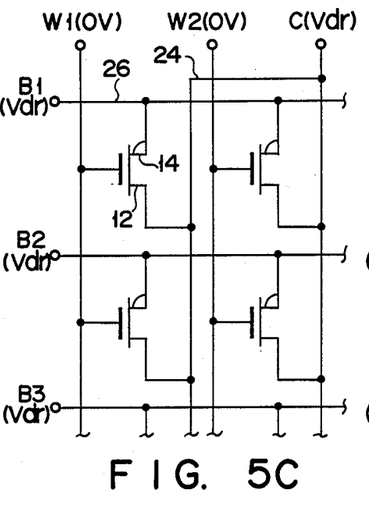
Figure 5D:
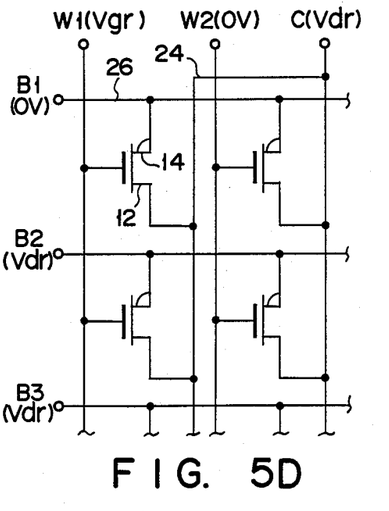

Referring now to FIGS. 5A to 5D, the operation of thus constructed EPROM of the first embodiment for data write/readout using the aforementioned "source/drain reversing" type accessing technique, will be explained below. Each illustration of FIGS. 5A-5D represents an equivalent circuit of four memory cells of the EPROM shown in FIG. 3. The equivalent circuits clearly illustrate that first diffusion layers 12 of all the memory cells are coupled to common wiring line C. FIG. 5A illustrates the application of voltage on word lines W, bit lines B and common wiring line C in the stand-by state (initial state) in data write mode of the EPROM. FIG. 5B illustrates the application of voltage on word lines W, bit lines B and common wiring line C in the cell selection state in data write mode. FIG. 5C illustrates the application of voltage on word lines W, bit lines B and common wiring line C in the stand-by state (initial state) in data read mode of the EPROM. FIG. 5D illustrates the application of voltage on word lines W, bit lines B and common wiring line C in the cell selection state in data read mode. In FIGS. 5A to 5D, the arc added to each symbol representing memory cell transistor indicates where floating gate 18 is located.

In data write mode of the EPROM (the mode in which bit data with either logic "1" or "0" is electrically written in a selected memory cell), first diffusion layer 12 coupled to common wiring line C is used as a source, and second diffusion layer 14 is used as a drain. In the stand-by state of the data write mode, the ground potential (0 volts) is applied to all the bit lines Bi (i=1, 2, ...), all the word lines Wj (j=1, 2, ...) and common wiring line C, as shown in FIG. 5A. In this state, to select a memory cell, positive voltages Vdp and Vgp are respectively applied, for example, to bit line B1 and word line W1. Consequently, positive voltages Vdp and Vgp are respectively applied to second diffusion layer 14 (serving as the drain) and control gate 16 (see FIG. 4) of the selected memory cell, and hot carriers (electrons in this embodiment) are produced in the vicinity of second diffusion layer 14 of channel region CH (see FIG. 4), then injected in floating gate 18 and trapped there. This stores data in floating gate 18 of the selected memory cell in terms of voltage. (As shown in FIGS. 5A and 5B, common wiring line C is held at the ground voltage throughout the stand-by state and cell selection state of the write mode.)

In data read mode of the EPROM (the mode in which bit data with either logic "1" or "0" is electrically read out from a selected memory cell), the functions of first diffusion layer 12 coupled to common wiring line C and second diffusion layer 14 in the above data write mode are reversed: now first diffusion layer 12 serving as a drain and second diffusion layer 14 serving as a source. In the stand-by state of the data read mode, the ground potential (0 volts) is applied to all the word lines Wj (j=1, 2, ...) as illustrated in FIG. 5C. At this time, bit lines Bi (i=1, 2, ...) and common wiring line C have applied thereto a positive voltage Vdr high than the ground voltage by a given level. When the potential of bit line B1 that is coupled to the selected memory cell (a target for data readout access) is dropped to the ground potential (or 0 volts) from Vdr and at the same time word line W1 coupled to the selected memory cell is raised to a positive voltage Vgr from the ground potential (0 volts), then second diffusion layer 14 (now serving as the source) of the selected memory cell is grounded so that its control gate 16 (see FIG. 4) is applied with the positive voltage Vgr. As a result, the data stored in the selected memory cell is read out. In the data readout operation, the logic level of the bit data stored in the selected cell is determined by detecting whether the potential of bit line B1 dropped to the ground potential retains its potential or increases, i.e., whether or not current flows between first and second diffusion layers 12 and 14. (As shown in FIGS. 5C and 5D, common wiring line C is kept at the positive voltage Vdr throughout the stand-by state and cell selection state of the read mode.)

According to the embodiment which is arranged and operates as described above, all bit lines Bi are initially biased at positive voltage Vdr in the stand-by state of the data read mode, and cell selection is then executed by dropping the potential of a desired bit line to the ground potential. In both the data write and read modes using the "source/drain reversing" type accessing technique, therefore, it is possible to eliminate the need to change the potential of first diffusion layer 12 of each memory cell between the stand-by and cell selection states of either mode. In other words, in the stand-by and cell selection states of the data write mode, the potential of first diffusion layer 12 (serving as a source) of the memory cell is permitted to be fixed at the ground potential (0 volts), while in the stand-by and cell selection states of the data read mode, the potential of the layer 12 (serving as a drain) is permitted to be maintained at the positive voltage Vdr. This means that first diffusion layers 12 of all the memory cells of the EPROM can be coupled together to common wiring line C. Therefore, unlike the conventional EPROM shown in FIGS. 1 and 2, the EPROM of this invention need not employ the "double-bit line structure." This eliminates the need to provide separate contact holes (7 and 8 in FIG. 2) in first and second diffusion layers 12 and 14 of each memory cell and can reduce the quantity of the necessary bit lines, thus ensuring a significant reduction in the element-occupying are of the EPROM and simplification of the wiring pattern. This effect would be easily understood simply by visual comparison between the planar structures shown in FIGS. 1 and 3.

Further, according to this invention, as the potential of the diffusion layer pattern 24 that serves as common wiring line C does not vary throughout both the stand-by state and the cell selection state in each operation mode, the accessing speed can be improved. This is because if the potential of common wiring line pattern 24 generally having relatively large capacitance and resistance does change between the stand-by state and the cell selection state, charging/discharging inherently occurs at the common wiring line pattern 24 itself, which interferes with the high speed accessing operation.

It is to be noted that, according to the EPROM of this invention, control gate 16 of each memory cell is located close to first diffusion layer 12 that is coupled to common wiring line C. It can thus be expected to improve the efficiency for writing data carriers. This is because that with the positional relationship between control gate 16 and floating gate 18 set as shown in FIG. 4 and with the use of the aforementioned voltage applying technique for cell accessing that has been explained referring to FIGS. 5A–5D, the substrate voltage Vsub can be accurately dropped to 0 volts in the data write mode. This phenomenon will be explained more specifically. In the data write mode first diffusion layer 12 of each memory cell is coupled together with those of the other memory cells to the ground potential. At this time, the bias voltage corresponding to the threshold voltage of transistors that constitute a bit line selection circuit is maximally restricted from being added to the substrate voltage Vsub. Therefore, the substrate voltage Vsub can accurately be dropped to 0 volts. As a result, the voltage margin can be increased. This allows a larger drain current to be applied to the selected memory cell and a greater amount of hot carriers to be supplied to floating gate 18.

It should be noted that according to this invention, since in the data read mode the potential of second diffusion layer (serving as a source) of the selected memory cell is dropped to the ground level as explained above, a negative bias is applied to substrate 10 due to the presence of the bit line selection circuit and the substrate voltage Vsub is dropped to have a negative voltage level accordingly. However, this fact also contributes to improve the writing characteristic of the EPROM because the action serves to improve the writing efficiency.

Figure 6:
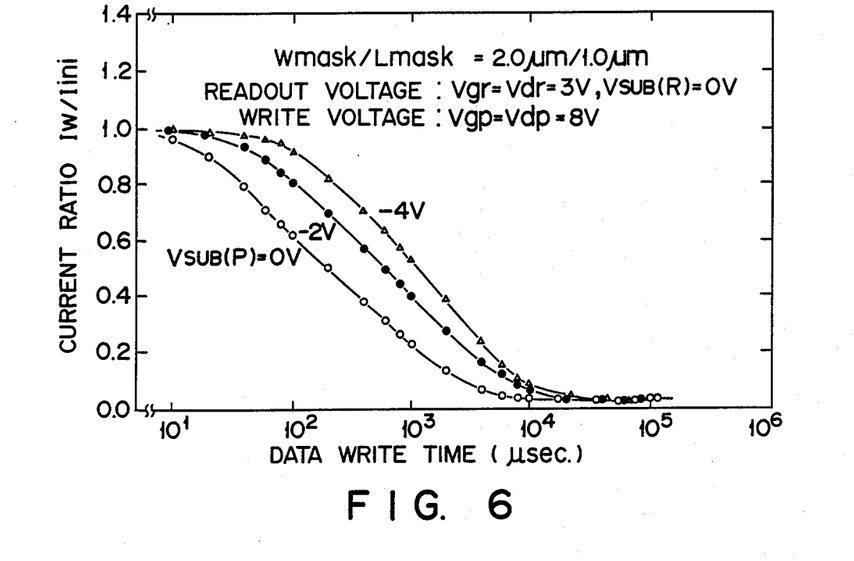
FIGS. 6 and 7 are characteristic graphs showing excellence of the data write characteristic of the EPROM of the first embodiment.
Figure 7:
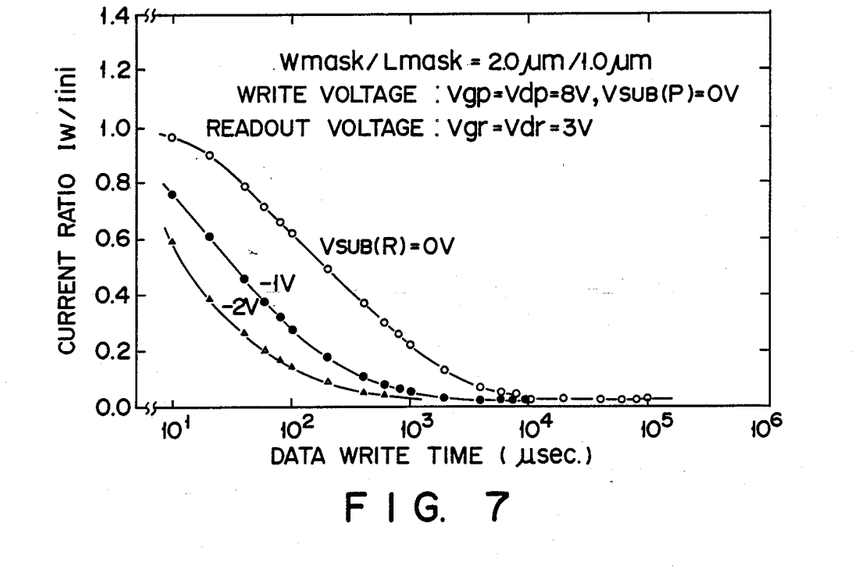

The above effects of this invention are supported by the graphs of FIGS. 6 and 7 that show experimental measurements for the writing characteristic plotted. In each graph the horizontal scale represents the time required to write data into an n channel type memory cell while the vertical scale represents the ratio (Iw/Iini) of the cell current Iw flowing after data writing to the initial cell current Iini before the data writing. In the experiments, the write gate voltage Vgp and write drain voltage Vdp were each set to 8 volts, and the read gate voltage Vgr and read drain voltage Vdr were each 3 volts. The width Wmask and length Lmask of a memory cell mask were respectively set to be 2.0 micrometers and 1.0 micrometers. It is obvious from FIG. 6 that with the substrate voltage Vsub of the EPROM set at 0 volts (see the curve having measurements marked by "0"), the data write time is the shortest. Similarly, it is obvious from FIG. 7 that the data write operation is the fastest when the substrate voltage Vsub is deeply negative-biased at the time of data reading (see the curve marked by "Δ"). This means negative-biasing the substrate voltage Vsub in the data read mode is preferable in view of improving the apparent writing characteristic.

Figure 8:
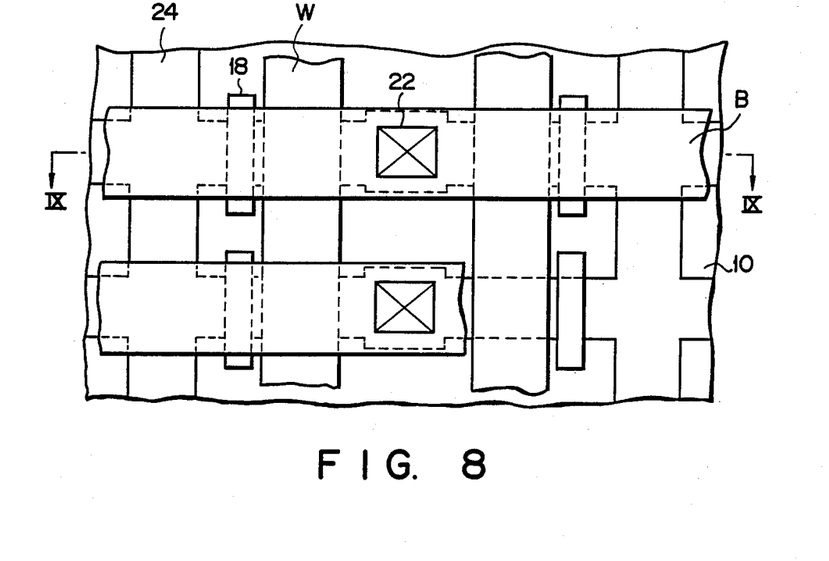
FIG. 8 is a schematic diagram illustrating the planar structure of an essential portion of an EPROM according to the second embodiment of this invention.
Figure 9:
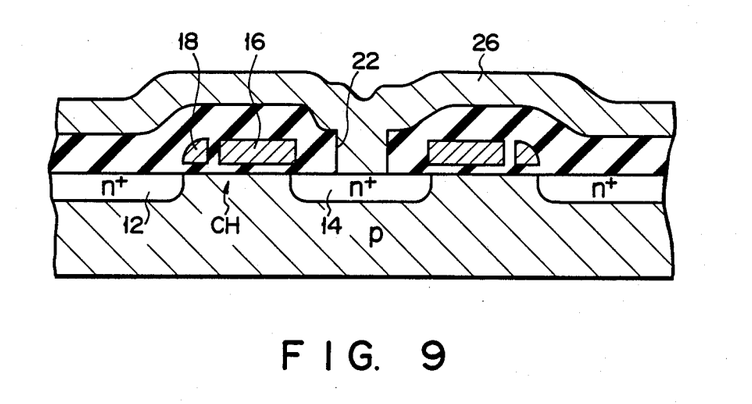
FIG. 9 is a cross-sectional view illustrating the EPROM of FIG. 8 along line IX—IX.

FIGS. 8 and 9 illustrate an EPROM according to the second embodiment of this invention: FIG. 8 illustrating the planar structure of the essential portion of the EPROM and FIG. 9 illustrating the cross section of FIG. 8 along line IX—IX. In these diagrams, the same reference numerals are used to specify elements which correspond or similar to those of the first embodiment to omit the explanation of the same.

According to the second embodiment, as shown in FIG. 9, floating gate 18 of each memory cell is located close to first diffusion layer 12 coupled to diffusion layer 24 that serves as common wiring line C, and control gate 16 is located close to second diffusion layer 14 that is coupled to bit line B. The above-described accessing technique of this invention can also be applied to an EPROM which has memory cells having the illustrated structure.

Figure 10A:
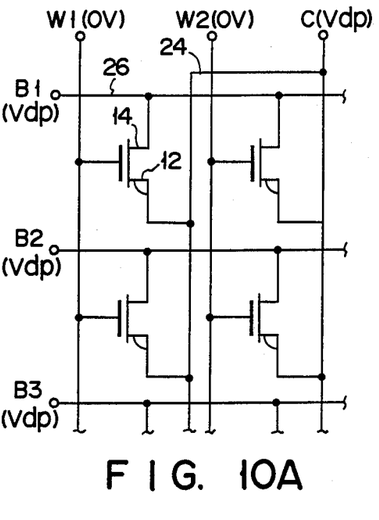
FIGS. 10A to 10D are diagrams illustrating equivalent circuits of an essential portion of the EPROM according to the second embodiment, for explaining data write/read mode of this EPROM.
Figure 10B:
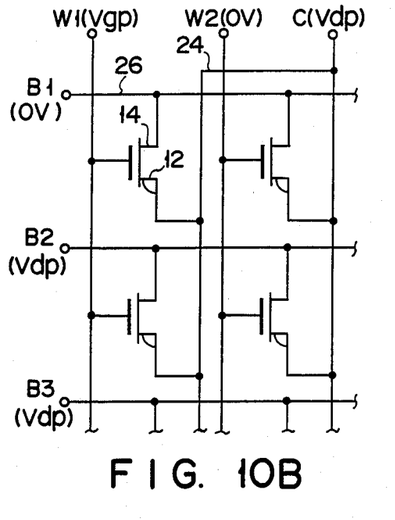

In the stand-by state of data write mode, since the positional relationship between control gate 16 and floating gate 18 of the second embodiment is the reverse of that of the first embodiment, bit lines B1, B2, ... and common wiring line C have applied thereto a positive high voltage Vdp as shown in FIG. 10A. At this time, word lines W1, W2, ... have applied thereto the ground potential. Consequently, first diffusion layer 12 of each memory cell which is this time serving as a drain, has applied thereto with the positive voltage Vdp, while second diffusion layer serving as a source is also applied with the positive voltage Vdp. In the cell selection state, the bit line (e.g., B1) coupled to the desired memory cell is grounded and at the same time the potential of the word line (e.g., W1) coupled to this memory cell is raised to the positive voltage Vgp. As a result, hot carriers are injected into floating gate 18 of the selected memory cell and accumulated there to write data.

Figure 10C:
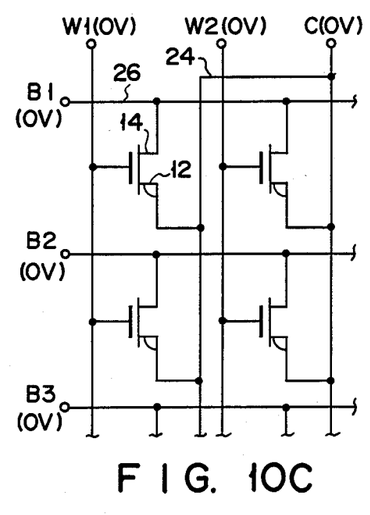
Figure 10D:
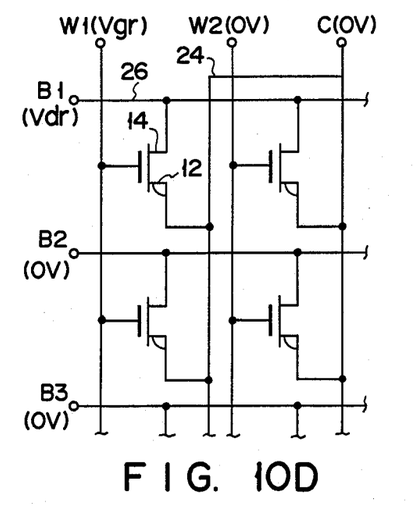

In the stand-by state of data read mode, all of bit lines B1, B2, ..., word lines W1, W2, ... and common wiring line C are fixed to the ground potential as shown in FIG. 10C. Consequently, first diffusion layer 12 (serving as a source) and second diffusion layer 14 (serving as a drain) of each memory cell are grounded. In the cell selection state, as shown in FIG. 10D, the potential of the bit line (e.g., B1) coupled to the desired memory cell is raised to the positive voltage Vgr from the ground potential and at the same time the potential of the word line (e.g., W1) coupled to this memory cell is raised to the positive voltage Vgr. As a result, the hot carriers stored in floating gate 18 of the selected memory cell are read out. At this time, the logic level of the read data is determined by detecting whether the potential of bit line B1 remains at Vdr or drops to the ground level.

Figure 11:
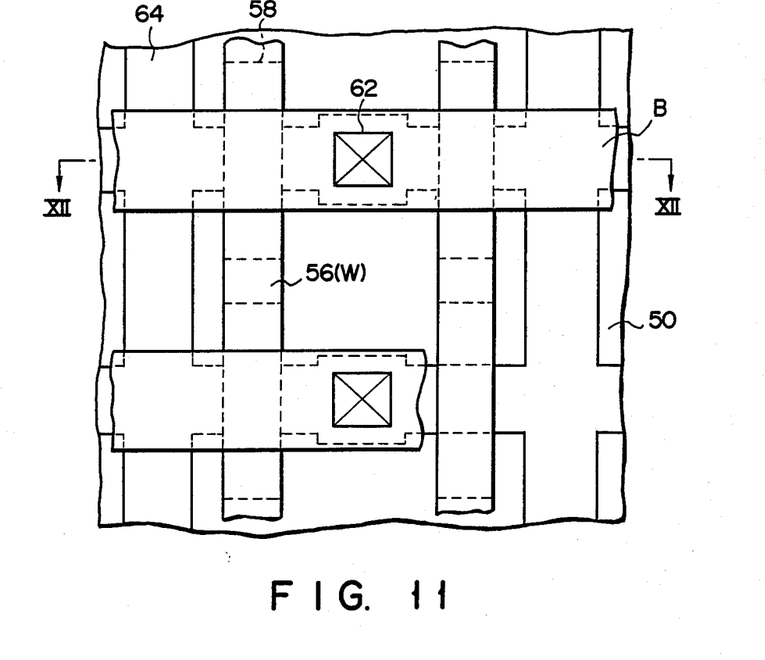
FIG. 11 is a schematic diagram illustrating the planar structure of an essential portion of an EPROM according to the third embodiment of this invention.
Figure 12:
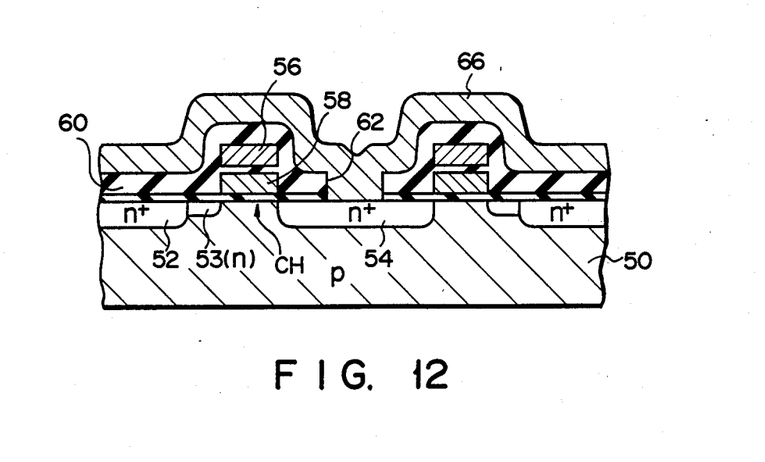
FIG. 12 is a cross-sectional view illustrating the EPROM of FIG. 11 along line XII—XII.

Referring now to FIGS. 11 and 12, there is shown an EPROM according to the third embodiment in which each memory cell has a laminated type (or slaked type) double-gate structure. FIG. 12 illustrates the cross section of the planar structure of FIG. 1 along line XII—XII, which includes two neighboring cells. As shown in FIG. 12 a silicon substrate 50 has a p conductivity type. First and second n+ type diffusion layers 52 and 54 are formed on substrate 50. An n type diffusion layer 53 is formed in that substrate surface region between these diffusion layers 52 and 54 in such a manner as to be connected to first diffusion layer 52, thereby forming a "lightly-doped drain (LDD) structure." (The substrate surface region defines channel region CH.) Above channel region CH of substrate 50 is a floating gate layer 58 insulatively provided, above which a control gate layer 56 is insulatively provided.

An insulation layer 60 is deposited on substrate 50 so as to cover control gate 56 and floating gate 58. Control gate 56 extends over an array of memory cells to constitute a word line W. Floating gate 58 is independent in each cell. Insulation layer 60 has a contact hole 62 formed above second diffusion layer 54. First diffusion layer 52 is coupled to an elongated n type diffusion layer 64, which is formed at a surface region of substrate 50 and serves as common wiring line C. Second diffusion layer 54 is coupled through contact hole 62 to a linear conductive layer 66, which is formed on insulation layer 60 and serves as bit line B.

Thus arranged EPROM according to the third embodiment is accessed for data write/read operation using the accessing technique that has already been explained referring to FIGS. 5A to 5D. The above arrangement can provide an EPROM with a high integration density and high performance, i.e., an EPROM which is excellent in data write/read characteristic and has a high accessing speed.

Figure 13:
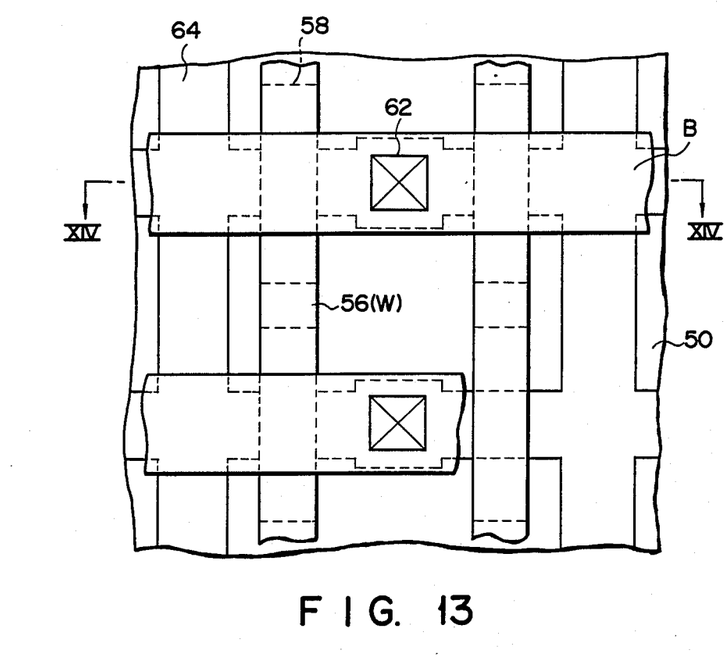
FIG. 13 is a schematic diagram illustrating the plan structure of an essential portion of an EPROM according to the fourth embodiment of this invention.
Figure 14:
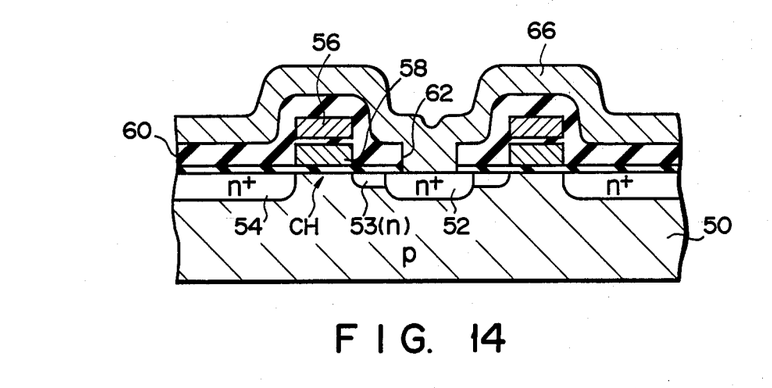
FIG. 14 is a cross-sectional view illustrating the EPROM of FIG. 13 along line XIV—XIV.

According to the fourth embodiment illustrated in FIGS. 13 and 14, each memory cell with a laminated type double-gate structure has first and second diffusion layers 52 and 54 arranged in the reverse locations of those used in the third embodiment. More specifically, first diffusion layer 52 and n type layer 53 are coupled to layer 66 that serves as bit line B, while second diffusion layer 54 is coupled to layer 64 that serve as common wiring line C. The other portion of the structure of the fourth embodiment is the same as that of the third embodiment. The EPROM of the fourth embodiment is accessed for data write/read operation using the accessing technique that has already been described with reference to FIGS. 10A to 10D. This arrangement can provide an EPROM with a high integration density and high performance, i.e., an EPROM which is excellent in data write/read characteristic and has a high accessing speed.

Although the invention has been described with reference to specific embodiment, it shall be understood by those skilled in the art that numerous modifications may be made that are within the spirit and scope of the inventive contribution.

Figure 15:
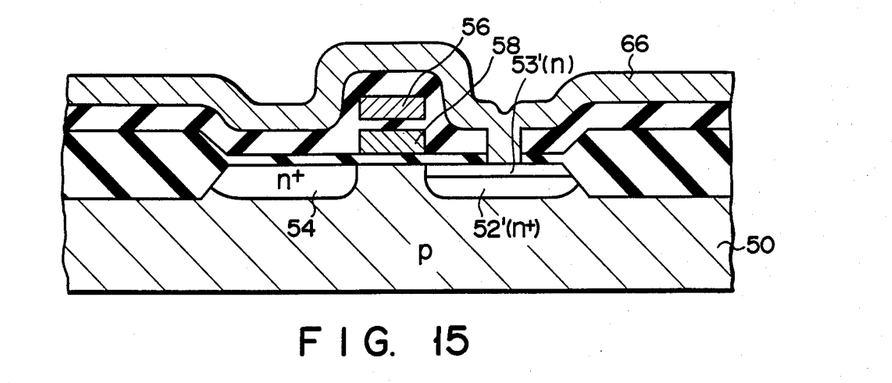
FIGS. 15 to 17 are cross-sectional views respectively illustrating modifications of the memory cell structure of the EPROM of the invention.
Figure 16:
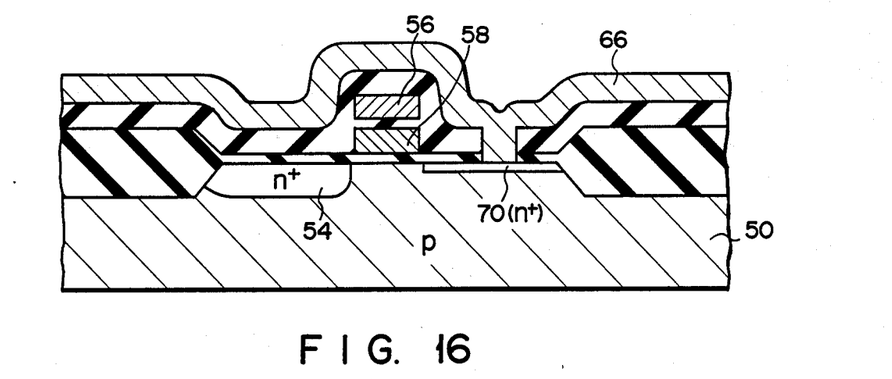
Figure 17:
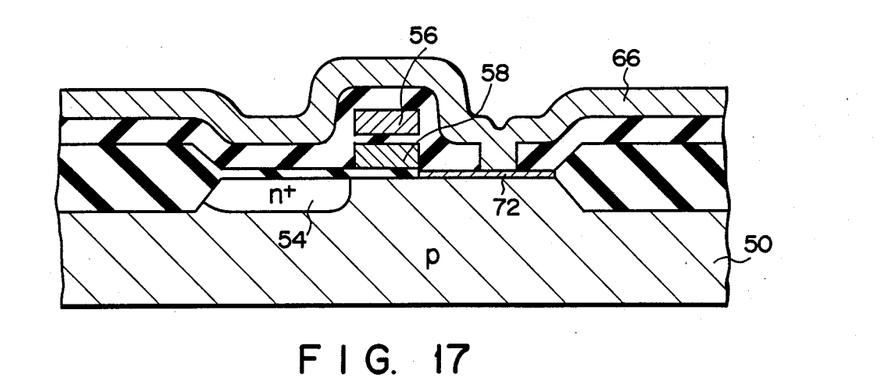

For instance, the memory cell that has the laminated type double-gate structure as employed in the third and fourth embodiments may be modified in various manners as follows. According to the modification shown in FIG. 15, the second diffusion layer of each memory cell is constituted by the lamination of an n+ type diffusion layer 52' and an n type diffusion layer 53'. The n+ type diffusion layer 52' has an impurity concentration of $10^{19}$ to $10^{20}/cm^3$ and n type diffusion layer 53' has an impurity concentration of approximately $10^{17}/cm^3$. According to another modification shown in FIG. 16, the second diffusion layer of each memory cell is constituted by an n+ type diffusion layer 70 that is formed shallower than first diffusion layer 52. According to a further modification shown in FIG. 17, the second diffusion layer of each memory cell is constituted by a conductive layer 72, which is made of metal or metal silicide deposited on substrate 50. This conductive layer 72 forms a Schottky junction between itself and silicon substrate 50.

In all of the aforementioned embodiments, a p type substrate is used, but an n type substrate can be used as well. In this case, the polarity of the voltages applied to bit lines B, word lines W and common wiring line C for memory accessing need only to be reversed from what has been specified in the foregoing description.

What is claimed is:

1. A non-volatile semiconductor memory device comprising:
    (a) a semiconductive substrate of a first conductivity type;
    (b) parallel bit lines provided above said substrate;
    (c) parallel work lines provided above said substrate so as to insulatively cross said bit lines;
    (d) a first semiconductive diffusion layer of a second conductivity type, provided in said substrate, for serving as a common wiring line;
    (e) memory cells formed on said substrate in such a manner as to be connected to cross points between said bit lines and said word lines, each of said memory cells comprising,
    second and third semiconductive diffusion layers of the second conductivity type, formed in said substrate spaced apart from each other, said second diffusion layer being connected to said common wiring line, said third diffusion layer being connected to one of said bit lines, said second and third diffusion layers respectively functioning as source and drain in a data write mode and respectively functioning as drain and source in a data read mode of said memory device,
    a floating gate layer, insulatively provided above said substrate, for storing carriers representing information, and
    a control gate layer insulatively provided above said substrate and connected to one of said word lines; and
    (f) voltage applications means, connected to said memory cells, for initially applying a bias voltage to said bit lines and said common wiring line while said word lines are grounded in one of the data write mode and the data read mode of said memory device, and for selecting a desired memory cell by dropping the applied voltage to that bit line which is connected to the desired memory cell.

2. The device according to claim 1, wherein said floating gate layer and said control gate layer are located laterally adjacent each other above said substrate.

3. The device according to claim 2, wherein said floating gate layer is located closer than said control gate layer to said third diffusion layer, and said control gate layer is located closer than said floating gate layer to said second diffusion layer.

4. The device according to claim 1, wherein said control gate layer is provided vertically above said floating gate layer and insulatively separated from said floating gate layer.

5. The device according to claim 3, wherein said voltage application means applies, in the data read mode, a bias voltage to aid second and third diffusion layers while initially applying a ground voltage to said control gate layer, and drops said bias voltage on said third diffusion layer so as to select the desired memory cell, whereby a voltage potential of said second diffusion layer is kept fixed to the bias voltage when the desired memory cell is selected.

6. The device according to claim 5, wherein said voltage application means initially applies, in the data write mode, a ground voltage to said second and third diffusion layers and said control gate layer, and changes voltage levels on said third diffusion layer and said control gate layer so as to select the desired memory cell, whereby a voltage potential of said second diffusion layer is kept fixed to the ground voltage when the desired memory cell is selected.

7. The device according to claim 2, wherein said floating layer is located closer than said control gate layer to said second diffusion layer, and said control gate layer is located closer than said floating gate layer to said third diffusion layer.

8. The device according to claim 7, wherein said voltage application means applies, in the data write mode, a bias voltage to said second and third diffusion layers while the initially applying a ground voltage to said control gate layer, and drops said bias voltage on said third diffusion layer so as to select the desired memory cell, whereby a voltage potential of said second diffusion layer is kept fixed to the bias voltage when the desired memory cell is selected.

9. The device according to claim 8, wherein said voltage application means initially applies, in the data and read mode, a ground voltage to said second and third diffusion layers and said control gate layer, and changes voltage levels on said third diffusion layer and said control gate layer so as to select the desired memory cell, whereby a voltage potential of said second diffusion layer is kept fixed to the ground voltage when the desired memory cell is selected.

10. The device according to claim 4, wherein said second and third diffusion layers are asymmetrically formed in said substrate.

11. The device according to claim 10, wherein said second and third diffusion layers are different in impurity concentration from each other.

12. The device according to claim 10, wherein said second and third diffusion layers are different in thickness in each other.

13. A non-volatile semiconductor memory device comprising:
   (a) a semiconductive substrate of a first conductivity type;
   (b) parallel bit lines provided above said substrate;
   (c) parallel word lines provided above said substrate so as to insulatively cross said bit lines;
   (d) a first semiconductive diffusion layer of a second conductivity type, provided in said substrate, for serving as a common wiring line;
   (e) memory cells formed on said substrate in such a manner as to be connected to cross points between said bit lines and said word lines, each of said memory cells comprising,
   a second semiconductive diffusion layer of the second conductivity type, formed in said substrate and a metallic Schottky layer formed on said substrate and spaced apart from said second diffusion layer, said second diffusion layer being connected to said common wiring line, said metallic Schotty layer being connected to one of said bit lines, said second diffusion layer and said metallic Schotty layer respectively functioning as source and drain in a data write mode and respectively functioning as drain and source in data read mode of said memory device,
   a floating gate layer, insulatively provided above said substrate, for storing carrier representing information, and
   a control gate layer insulatively provided above said substrate and connected to one of said word lines; and
   (f) voltage application means, connected to said memory cells, for initially applying a bias voltage to said bit lines and said common wiring line while said word lines are grounded in one of the date write mode and the data read mode of said memory device, and for selecting a desired memory cell by dropping the applied voltage so that the bit line which is connected to the desired memory cell.

14. The device according to claim 13, wherein said control gate layer is provided vertically above said floating gate layer and insulatively separated from said floating gate layer.

* * * * *